United States Patent
Hokari et al.

(10) Patent No.: US 6,618,087 B1
(45) Date of Patent: Sep. 9, 2003

(54) SOLID-STATE IMAGE DEVICE

(75) Inventors: Yasuaki Hokari, Tokyo (JP); Yukio Taniji, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/208,704

(22) Filed: Dec. 10, 1998

(30) Foreign Application Priority Data

Dec. 11, 1997 (JP) ............................................. 9-340467

(51) Int. Cl.[7] ................................................... H04N 3/14
(52) U.S. Cl. ........................ 348/311; 348/243; 348/274
(58) Field of Search .................... 348/303, 319

(56) References Cited

U.S. PATENT DOCUMENTS

| | | | | |
|---|---|---|---|---|
| 4,135,112 A | * | 1/1979 | Fisher et al. ................ 313/470 |
| 4,672,221 A | * | 6/1987 | Saito et al. ............... 250/208.1 |
| 5,081,347 A | * | 1/1992 | Matsumoto .............. 250/208.1 |
| 5,233,130 A | * | 8/1993 | Nishino ..................... 174/52.2 |
| 5,274,250 A | * | 12/1993 | Miyake et al. ............... 257/294 |
| 5,371,397 A | * | 12/1994 | Maegawa et al. ........... 257/229 |
| 5,426,058 A | * | 6/1995 | Nakai et al. ..................... 437/2 |
| 5,506,430 A | * | 4/1996 | Ohzu ......................... 257/292 |
| 5,576,239 A | * | 11/1996 | Hatano et al. ................ 438/69 |
| 5,691,548 A | | 11/1997 | Akio |
| 5,847,381 A | * | 12/1998 | Isogai ..................... 250/208.1 |
| 5,920,346 A | * | 7/1999 | Nakashiba ................... 257/232 |
| 5,942,774 A | * | 8/1999 | Isogai et al. ................ 257/257 |

FOREIGN PATENT DOCUMENTS

| JP | 61-280659 | | 12/1986 | |
|---|---|---|---|---|
| JP | 61280659 A | * | 12/1986 | .......... H01L/27/14 |
| JP | 04337667 A | * | 11/1992 | .......... H01L/27/14 |
| JP | 4-337667 | | 12/1992 | |

* cited by examiner

*Primary Examiner*—Andrew Christensen
*Assistant Examiner*—Brian Genco
(74) *Attorney, Agent, or Firm*—Choate, Hall & Stewart

(57) ABSTRACT

In a solid state image device which has at least a horizontal CCD register, the horizontal CCD register is covered with a light shielding film which is formed by a resin material.

11 Claims, 10 Drawing Sheets

SOLID-STATE IMAGE DEVICE

BACKGROUND OF THE INVENTION

This invention relates to a solid-state image device, and in particular, to a solid-state image device operable at driving with low power and a high frequency.

A conventional solid-state image device of two-dimensional CCD (namely, Charge Coupled Device) type mainly includes a plurality of photo-diodes, a plurality of vertical CCD registers, a horizontal CCD register, a charge detection portion and an amplification portion.

In this event, the photo-diodes are two-dimensionally arranged on an image region, and each of them carries out a photoelectric conversion operation. Electric signal charges converted by each photo-diode are transferred to the vertical CCD register coupled to the photo-diode and are vertically sent to the horizontal CCD register.

The electric signal charges sent to the horizontal CCD register are horizontally transferred through the horizontal CCD register. The transferred signal charges are detected as a voltage by the charge detection portion and are thereafter amplified by the amplification portion.

More specifically, when an image pattern is projected on the image region of the solid-state image device by the use of an optical system, each of the photo-diodes generates electrical charges dependency on an amount of an incident light beam by the photoelectric conversion operation.

The generated electric charges are given to the vertical CCD register for a preselected period. The signal charges given to the vertical CCD register are transferred from the vertical CCD register to the horizontal CCD register for every blanking duration. Subsequently, the horizontal CCD register moves the electric charges towards the charge detection portion. The charge detection portion generates a voltage in dependency upon the transferred charge quantity, and sends it to the amplification portion. The amplification portion amplifies the voltage into an amplified output voltage.

Thereinafter, the above-mentioned operation is repeated at every photo-diodes in the solid-state image device. Thereby, the electric charges from each of the photo-diodes are successively produced in the form of image signals from the amplification portion.

Thus, the image signals can be obtained from the solid-state image device in a time sequence manner. In this event, it is necessary to prevent incidence of the light beam onto the vertical and horizontal CCD registers in order to accurately transfer the electrical charges through the vertical and horizontal CCD registers. To this end, a light shielding film is generally covered over the image region to shield or shade the vertical CCD registers and the horizontal CCD register. In this case, the light shielding film is opened at portions corresponding to the photo-diodes.

Thus, the light shielding film serves to shield both the vertical CCD registers and the horizontal CCD register. Herein, it is to be noted that the light shielding film for the vertical CCD film is formed by the same material as that of the horizontal CCD register. In this event, a metal film is often used as a material of the light shielding film in the conventional solid-state image device.

In consequence, a parasitic capacitor is inevitably caused to occur between the metal film and a charge transfer electrode (namely, an electrode layer) used in each of the horizontal and the vertical CCD registers. This parasitic capacitor leads to an increase of a driving voltage of the horizontal CCD register.

More specifically, it is to be noted that the electrical power in the solid-state image device is mainly consumed by the horizontal CCD register because the horizontal CCD register is driven at a high frequency of 10 MHz while the vertical CCD register is driven at a low frequency of several 10 KHz.

Herein, it is a recent trend that the number of pixels increases with high resolution of the image. In this condition, when a moving picture is projected, the horizontal CCD register must be driven at a higher frequency with the increase of the number of the pixels because a frame frequency is kept at a constant value.

However, as the driving frequency is increased, the power consumption is undesirably increased in the solid-state image device. For example, when the solid-state image device is used for a portable camera and the like, a battery is quickly consumed.

To reduce power consumption in the solid-state image device, it is preferable that the driving voltage of the horizontal CCD register is reduced. This means that the above-mentioned parasitic capacitor of the horizontal CCD register is favorably reduced.

SUMMARY OF THE INVENTION

It is therefore an object of this invention to provide a solid-state image device which is capable of reducing a parasitic capacitance with respect to an electrode.

It is another object of this invention to provide a solid-state image device which is capable of driving with high frequency without degradation of image quality.

According to this invention, a solid-state image device includes an image region, a horizontal CCD register, a first light shielding film, and a second light shielding film.

With such a structure, the image region has a plurality of optical-electrical conversion portions (namely, photo-diodes) two-dimensional arranged and a plurality of vertical CCD registers which are placed adjacent to said optical-electrical conversion portions.

In this event, the vertical CCD register vertically transfers electrical charge signals converted by the optical-electrical conversion portions.

The horizontal CCD register is coupled to the vertical CCD registers at one end side, and horizontally transfers the electrical charge signals.

In this condition, a first light shielding film covers the image region except for the optical-electrical conversion portions and is formed by a first material. On the other hand, the second light shielding film covers the horizontal CCD register and is formed by a second material.

Under this circumstance, the first material is different from the second material. Specifically, the first material is metal or metal silicide while the second material is resin.

Moreover, the horizontal CCD register includes a plurality of charge transfer electrodes for transferring the electrical charge signals under the second light shielding film. In this case, the second light shielding film is arranged so as to reduce a parasitic capacitance with respect to the charge transfer electrode.

Namely, a material different from the light shielding film formed for the image region is used as material of the light shielding film formed for the horizontal CCD register according to this invention. As a result, the power consumption of the solidstate image device is largely reduced with high image quality being kept. Further, the solid-state image device can be driven at higher frequency.

DESCRIPTION OF PREFERRED EMBODIMENTS

Referring to FIGS. 1 through 6, conventional solid-state image devices will be first described for a better understanding of this invention. The solid-state image devices are equivalent to a part of the conventional solid state image devices mentioned in the preamble of the instant specification.

Figure 1:
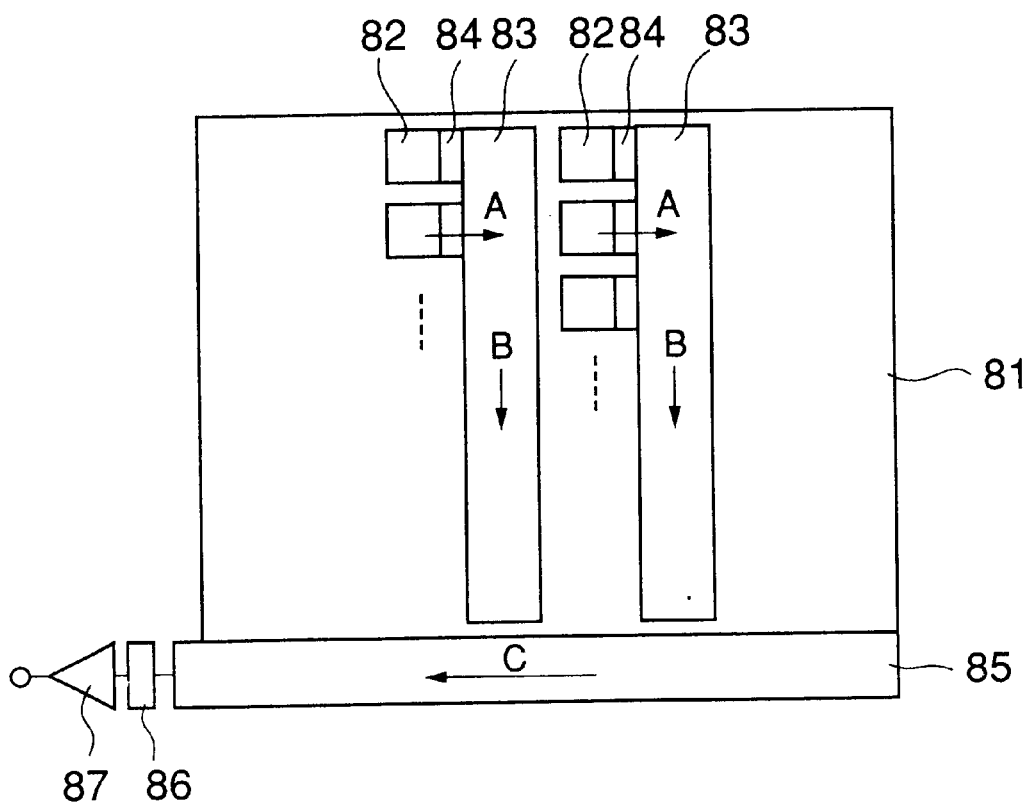
FIG. 1 is a plane view showing a structure of the conventional two-dimensional solid-state image device.

As shown in FIG. 1, a conventional solid-state image device of a two-dimensional CCD type mainly includes a plurality of photo-diodes 82, a plurality of vertical CCD registers 83, readout gates 84, a horizontal CCD register 85, a charge detection portion 86 and an amplification portion (namely, an amplifier) 87.

In this event, the photo-diodes 82 are two-dimensionally arranged on an image region 81, and each of them carries out a photoelectrical conversion operation. Signal charges or electric charges stored in each photo-diode 82 are read out to be sent to a desired vertical CCD register 83. The signal charges are transferred toward a vertical direction via the vertical CCD register 83. The signal charges transferred toward the vertical direction reach to the horizontal CCD register 85.

The signal charges sent to the horizontal CCD register 85 are transferred toward a horizontal direction through the horizontal CCD register 85. The transferred signal charges are detected as a voltage by the charge detection portion 86 and are amplified by the amplification portion 87.

In such a solid-state image device, when an image pattern is projected onto the image region 81 by the use of an optical system (not shown), each of the photo-diodes 82 carries out the photo-electrical conversion and generates electrical charges dependent on an amount of an incident light beam.

The generated electrical charges are given from each of the photo-diodes 82 to the vertical CCD register 83 for the preselected period (for example, 60 seconds) through each of the readout gates 84 that is simultaneously driven for the preselected period. As a result, the electrical charges are simultaneously moved to a direction as indicated by the arrow A in FIG. 1 to be sent to the vertical CCD register 83.

The signal charges are transferred from the vertical CCD registers 83 towards the horizontal CCD register 85 (to a direction as indicated by the arrow B). In this event, the charge transfer of the horizontal CCD register 85 is interrupted during the blanking duration.

In consequence, the horizontal CDD register 85 receives the signal charges per one pixel from all of the vertical CDD registers 83 in parallel for every blanking duration of horizontal scanning.

The horizontal CCD register 85 transfers the electrical charges from the vertical CCD registers 83 to the charge detection portion 86 during one horizontal scanning period.

The charge detection portion 86 generates a voltage dependency upon the transferred charge quantity, and sends it to the amplification portion 87. The amplification portion 87 amplifies the voltage from the charge detection portion 86 into an amplified voltage.

Thereinafter, the above-mentioned operation is repeated to pick up the image pattern. Thereby, the signal charges from the photo-diodes 82 two-dimensionally arranged are produced as the image signals in a time sequence from the amplification portion 87.

Thus, the image signals can be successively obtained in the solid-state image device. In this event, it is required to prevent incidence of a light beam for the vertical CCD registers 83 and the horizontal CCD register 85 to accurately transfer the electrical charges by the vertical CCD registers 83 and the horizontal CCD register 85.

Figure 2:
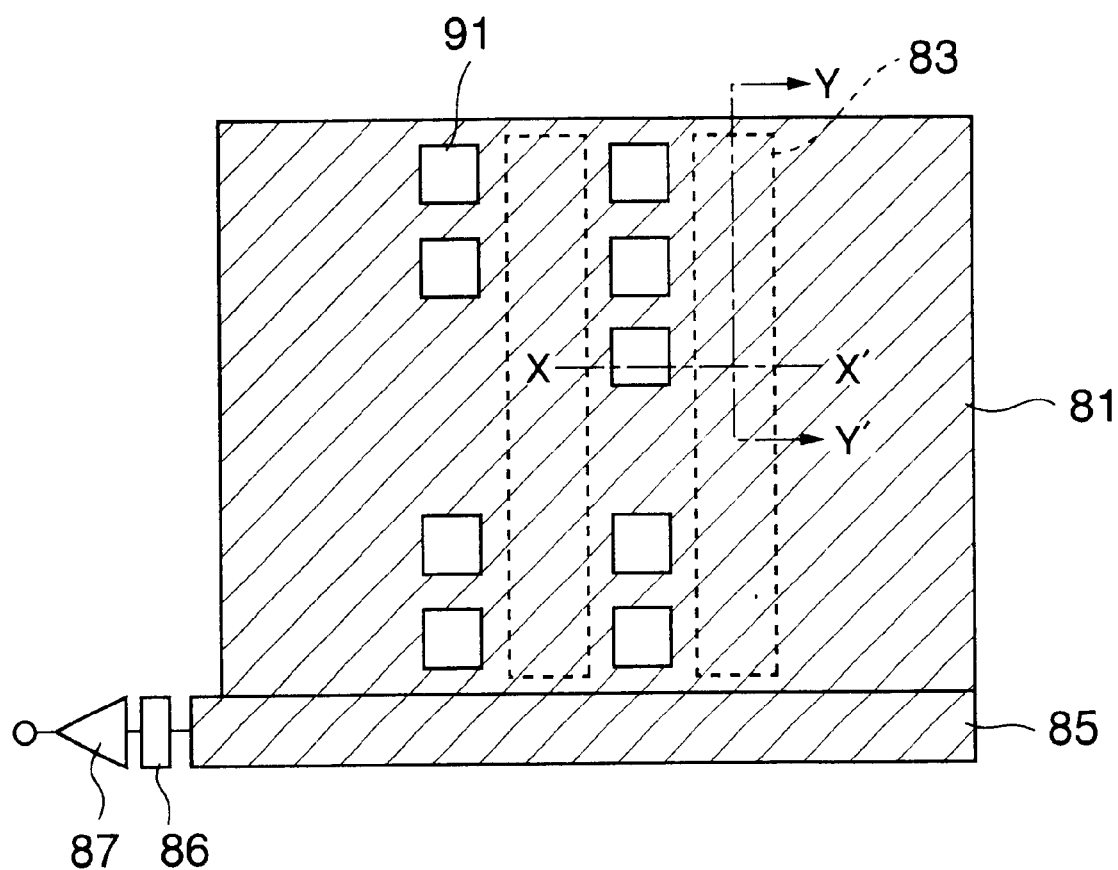
FIG. 2 is a plane view showing an arrangement of a light shielding film in the solid-state image device illustrated in FIG. 1.

To this end, a light shielding or shading film indicated by the hatching in FIG. 2 is generally coated over the image region 81 including the vertical CCD registers 83 and over the horizontal CCD register 85. In this case, the light shielding film has opening portions 91 corresponding to the photo-diodes 82, as illustrated in FIG. 2.

Figure 3:
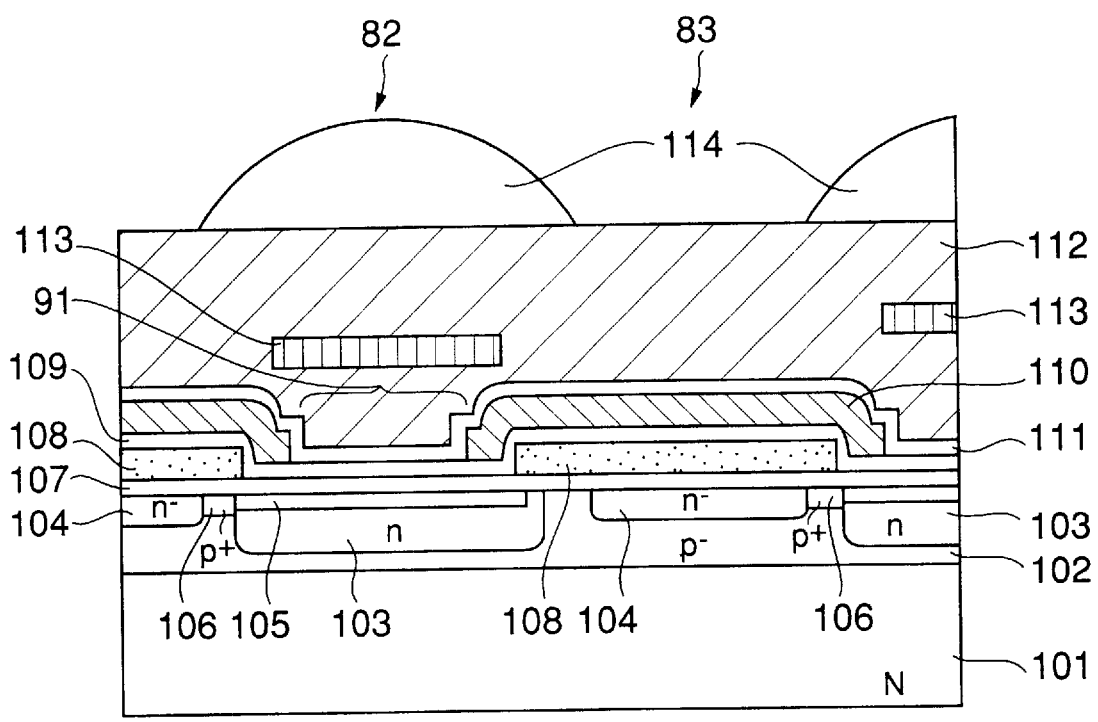
FIG. 3 is a cross sectional view, taken the solid-state image device in FIG. 2 along X–X' line.
Figure 4:
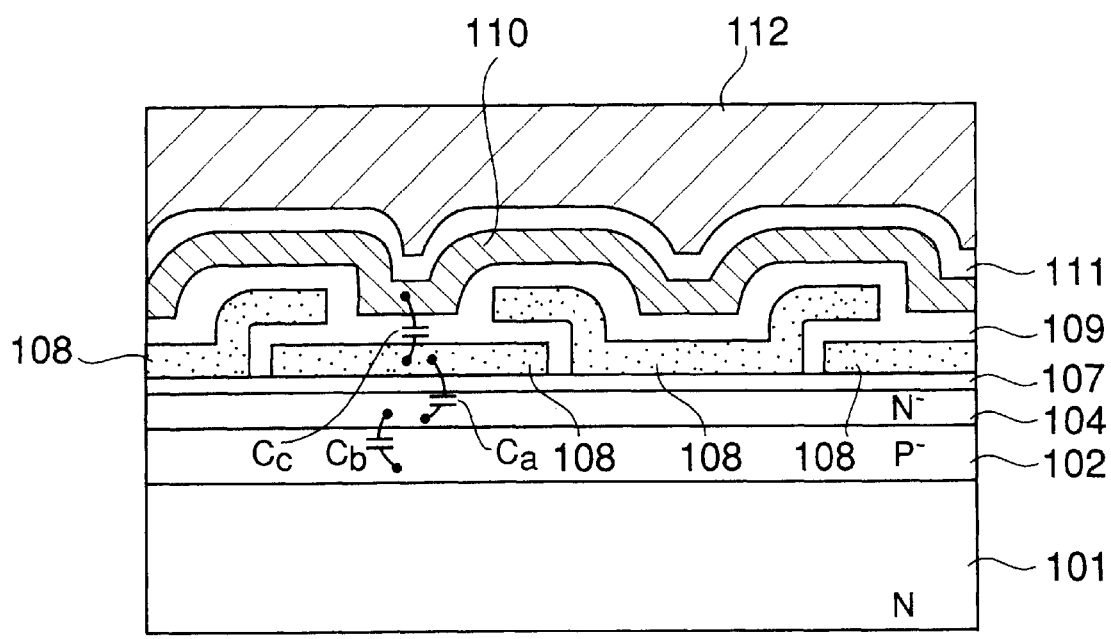
FIG. 4 is a cross sectional view, taken the solid-state image device in FIG. 2 along Y–Y' line.

Referring to FIGS. 3 and 4, description will be made about the light shielding film in more detail.

As shown in FIG. 3, the photo-diode 82 and the vertical CCD register 83 are placed on an N-type semiconductor substrate 101.

A p-well 102 is formed on the N-type semiconductor substrate 101.

In the P-well 102, an N-type region 103 and an N-type impurity layer 104 are formed.

In this event, the N-type region 103 constitutes the photo-diode 82 while the N-type impurity layer 104 becomes a channel region which is used to transfer the electrical charges toward the vertical CCD register 83.

Further, a P-type impurity layer 105 is formed on the N-type region 103. Moreover, a P-type high concentration impurity region 106, which separates the N-type region 103 from the channel region 104, is formed in the P-type well 102. A gate insulating film 107 is entirely formed on the exposed surface of each layer.

An electrode layer 108 is selectively formed on the gate insulating film 107. Herein, the electrode layer 108 serves as both a readout electrode and a transfer electrode. Further, an insulating film 109 is formed to cover the electrode layer 108. Moreover, the light shielding film 110 is formed on the insulating film 109 except for the opening portion 91, and an insulating film 111 is formed thereon.

A flattening film 112 is formed on the insulating film 111. Further, a color filter layer 113 is buried in the flattening layer 112 at a position corresponding to the photo-diode 82. Moreover, a micro-lens 114 is placed at the position corresponding to the photo-diode 82 on the flattening film 112.

With such a structure, an incident light beam for the micro-lens 114 is focused and reaches the color filter layer 113. The color filter 113 is divided into three kinds of filters corresponding to each color signal of red, green and blue (namely, RGB). These three kinds of color filter layers are arranged in a predetermined manner to form a layer corresponding to each color for each photo-diode 82.

A light beam, which transmits the color filter layer 113, passes through the opening portion 91, and transmits the insulating films 111 and 109, the gate insulating film 107, and the P-type impurity layer 105. The transmitted light beam reaches the N-type impurity layer 103, and the optical-electrical conversion operation is carried out to generate the electrical charges. The electrical charges are sent to the channel region 104 and transferred by controlling an applied voltage to the electrode layer 108.

As shown in FIG. 4, the vertical CCD register includes the N-type impurity layer 104 formed in the P-well 102, the gate insulating film 107 and the electrode layer 108 for transferring the electrical charges. In this event, the electrode layer 108 is divided along a lateral direction in FIG. 4 so that the N-type impurity layer 104 operable as the channel region transfers the electrical charges.

In this condition, pulse voltages, which have different phases to each other, are applied to the divided electrode layers 108.

Thereby, electrons move through the N-type impurity layer 104 in the form of the electrical charges.

In the meanwhile, it is to be noted that the horizontal CCD register basically has the same structure as the vertical CCD register.

Herein, a metal film, such as, aluminum, tungsten, and molybdenum, or a metal silicide film, such as, tungsten silicide and molybdenum silicide is generally used as the light shielding film 110 covered over the electrode layer 108 via the insulating film 109. In this case, the light shielding film 110 over the image region 81 including the vertical CCD registers 84 is generally formed by the same material and process as the light shielding film over the horizontal CCD register 85.

In general, the horizontal CCD register 85 is driven by a high frequency of 10 MHz or more. Further, for example, a pulse voltage of 5Vp-p is applied to the charge transfer electrode (namely, the electrode layer 108).

In the structure illustrated in FIG. 4, parasitic capacitance in connection with the electrode layer 108 is undesirably caused to occur and determined by a capacitance Ca due to the gate insulating film 107, a depletion layer capacitance Cb between the P-well 102 and the N-type impurity layer 104, and a capacitance Cc between the light shielding film 110 and the electrode layer 108.

Namely, the parasitic capacitance C is represented by the following equation.

$$C=C'+Cc$$

where C' represents a serial capacitance between Ca and Cb.

Further, power consumption P, which is wasted by the charge and discharge of the capacitance C, is represented by the following equation.

$$P=CV^2f$$

where f represents a driving frequency.

For instance, it is assumed that a conductive film, such as, metal, is used as the light shielding film 110 in the solid-state image device having an optical system of ⅔ inch in size. A total of the parasitic capacitance of the horizontal CCD register falls within the range between 450 and 500 pF. When the device is driven by 40 MHz and 5 V, the power consumption becomes 0.45 W to 0.50 W.

The electrical power in the solid-state image device is mainly consumed by the horizontal CCD register because the horizontal CCD register has a high driving frequency of 10 MHz and the vertical CCD register has a low driving frequency of several 10 KHz.

Recently, the number of pixels increases with high resolution of the image. In this condition, when a moving picture is projected, the horizontal CCD register must be driven at a higher frequency with the increase of the number of the pixels because the frame frequency is kept at a constant frequency (30 Hz).

However, when the driving frequency is increased, the power consumption is inevitably increased. This means that when the solid-state image device is used for a portable camera and the like, a battery is quickly consumed.

To solve this problem, the driving voltage of the horizontal CCD register must be lowered. In addition, it is necessary to reduce the parasitic capacitance with respect to the electrode layer 108 of the horizontal CCD register 85.

Herein, disclosure is made about a method of reducing capacitance with respect to an electrode layer in Japanese Unexamined Patent Publication No. Sho. 61-280659.

Although this method relates to a contact-type one dimensional image sensor, a black resin film is used as a light shielding film to reduce the capacitance in connection with the electrode layer.

Figure 5:
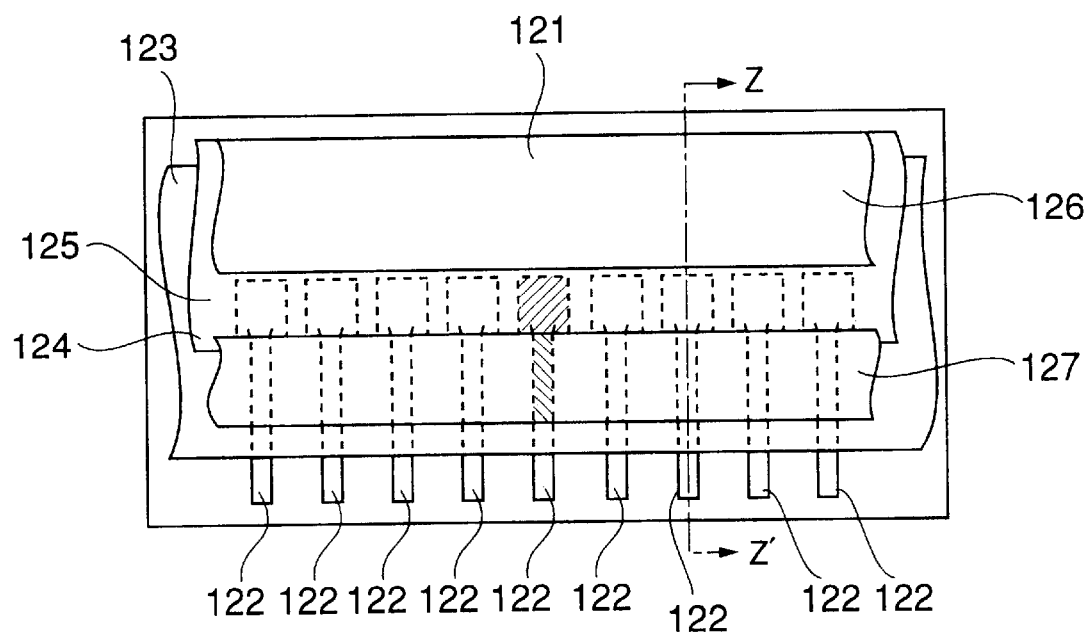
FIG. 5 is a plane view showing the conventional one-dimensional image sensor using a resin light shielding film.
Figure 6:
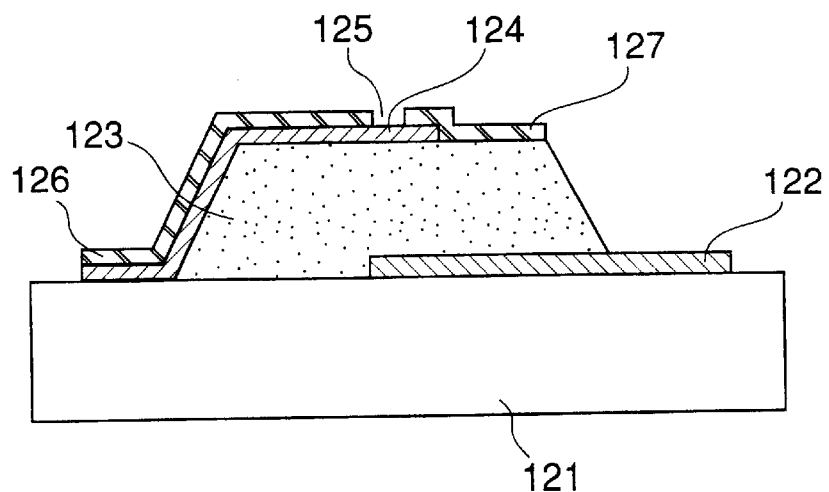
FIG. 6 is a cross sectional view, taken the image sensor in FIG. 5 along Z–Z' line.

As shown in FIGS. 5 and 6, a plurality of independent electrodes 122 are arranged on a glass substrate 121 in the above image sensor, and a photo-electrical conversion film 123 made by an amorphous silicon is formed thereon. A transparent electrode 124 is formed on the photoelectric conversion film 123.

Further, light shielding films 126 and 127 are formed thereon. In this case, the light shielding film 126 is made by metal while the light shielding film 127 opposite the independent electrodes 122 is formed by the black resin, as illustrated in FIGS. 5 and 6.

The capacitance regarding the electrode can be reduced by using the resin film as the light shielding film. Logically, the capacitance Cc illustrated in FIG. 4 may become approximately zero.

Under the above-mentioned condition, the total capacitance falls within the range between 270 and 300 pF (reduction of about 40%) while the power consumption falls within the range between 0.27 and 0.3 W.

However, in the two-dimensional solid-state image device, the light shielding film is not divided to two films like the one-dimensional image sensor and is formed by a single layer. Therefore, it is impossible to directly apply the conventional method for the solid-state image device.

In the meanwhile, the resin light shielding film is inferior in light shielding performance as compared to the metal film. Namely, when the metal film is used, an incident light beam can be decayed to $1/10^6$ or less under a thickness of about 0.3 μm. Thereby, the shielding performance of 100 dB or more, which is required for the image device, can be obtained.

In contrast, when the black resin film is used as the light shielding film, the incident light beam is decayed in the range between $1/100$ and 1/several 100 under the film thickness of 1 μm. In consequence, the light shielding performance of the resin is lower than that of the metal film.

A light beam having high brightness, such as, sunbeam, is often locally entered into the image region 81 of the solid-state image device. This light beam has high brightness of 1000 times or more for brightness of standard subject. Therefore, when the light shielding performance is insufficient, the photoelectric conversion occurs in the vertical CCD register by a light beam which transmits through the light shielding film. Consequently, an error signal is superimposed for the signal. The error signal results in image defect of white vertical stripe-like shape. This largely deteriorates image quality.

To prevent this, it is necessary that the resin shielding film has the thickness of about several μm. However, it is difficult to pattern the resin film with high resolution. In particular, it is impossible to accurately form the opening portion (width of 2 to 3 μm) for entering the light beam to the photo-diode in the thick resin light shielding film.

When dimension accuracy of the opening portion is low, area in which each photo-diode receives the light beam is fluctuated, and as a result, sensitivity is also varied. In consequence, shading phenomenon appears for an image display, and the image quality is largely degraded.

Further, the solid-state image device has the micro-lens. Consequently, when the light shielding film becomes thick, focussed distance must be enlarged. When the focussed distance becomes long, oblique component in incident light beams departs from the opening portion. As a result, when the diaphragm of a camera lens is opened, effective sensitivity is degraded.

Moreover, disclosure is made about a black dyeing layer as the light shielding film in Japanese Unexamined Patent Publication No. Hei. 4-337667. However, this publication does not disclose the above-mentioned problems at all.

Taking the above-mentioned problems into consideration, this invention provides a solid-state image device which is capable of reducing parasitic capacitance with respect to an electrode and driving with a high frequency without degradation of image quality.

Figure 7:
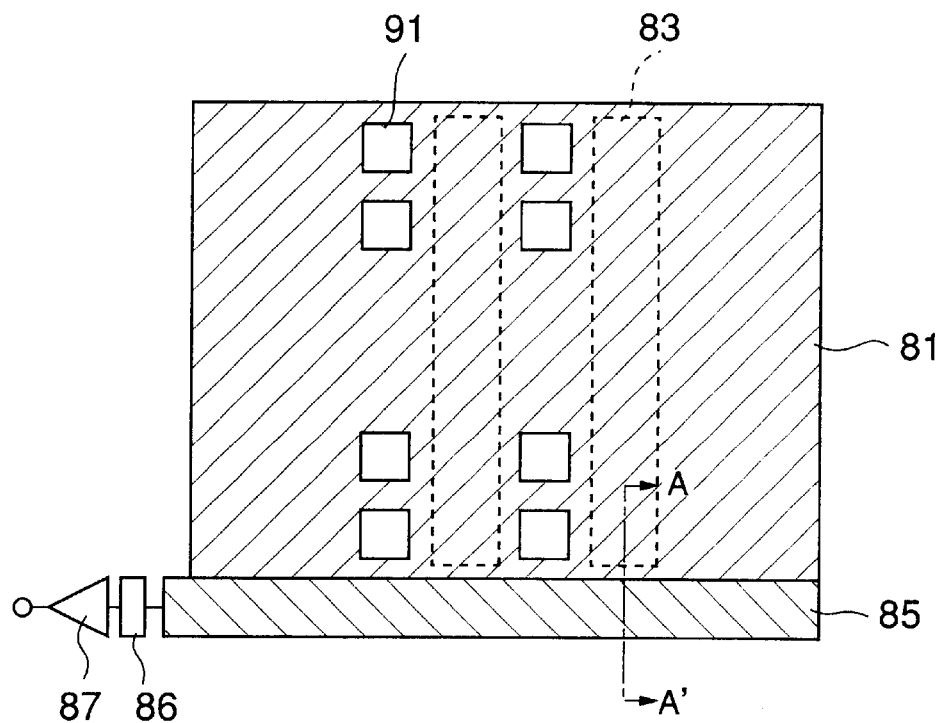
FIG. 7 is a plane schematic view showing a solid-state image device according to a first embodiment of this invention.

Referring to FIG. 7, description will be made about a first embodiment of this invention.

Herein, the same reference numerals are attached to the same components in the conventional case, and therefore, the description thereof will be abbreviated.

A two-dimensional solid-state image device includes a first light shielding film (indicated by the hatching of upper right-hand) formed for an image region 81 including vertical CCD registers 83 and a second light shielding film (indicated by the hatching of upper left-hand) formed for a horizontal CCD register 85, as illustrated in FIG. 7. In this event, the first light shielding film is formed by a metal or a metal silicide while the second light shielding film is made by resin.

Figure 8:
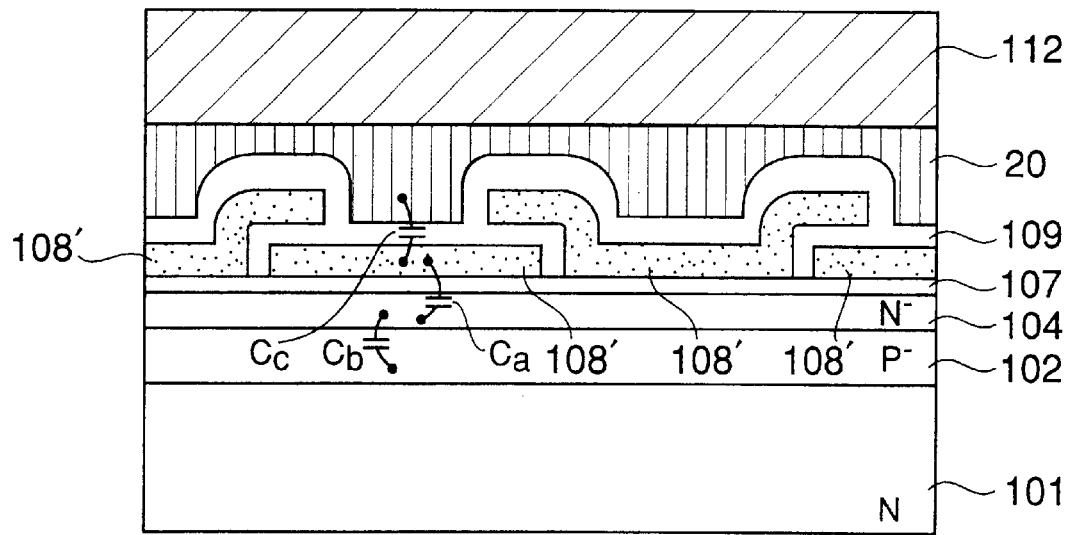
FIG. 8 is a partial cross sectional view showing a horizontal CCD device in the solid-state image device illustrated in FIG. 7 along an electric charge transfer direction.

The horizontal CCD register 85 illustrated in FIG. 8 is different from the vertical CCD register 83 illustrated in FIG. 4 in the structure. Namely, a resin light shielding film 20 is used instead of the metal light shielding film 110 (illustrated in FIG. 4) in FIG. 7. Further, the insulating film illustrated in FIG. 4 is unnecessary because the resin light shielding film is formed by an insulator.

Besides this point, the horizontal CCD register 85 is basically identical with the vertical CCD register 83 in the structure.

Thus, the resin light shielding film 20, which is not conductive, is used in the first embodiment. In consequence, capacitance Cc between an electrode layer 108' and the resin light shielding film 20 becomes approximately zero. As a result, the total parasitic capacitance is reduced about 40% as compared to the conventional case.

Figure 9:
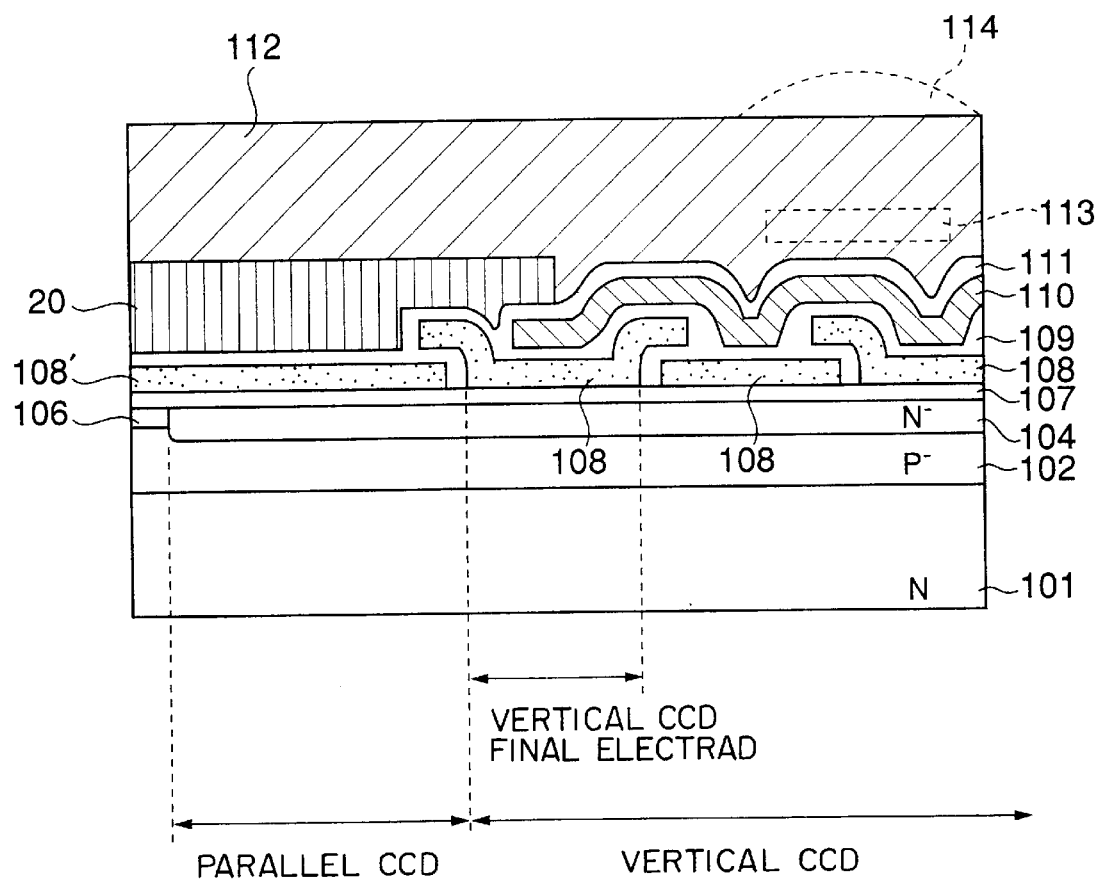
FIG. 9 is a cross sectional view, taken the solid-state image device illustrated in FIG. 7 along A–A' line.

In FIG. 9, the vertical CCD register 83 is illustrated in the right hand side while the horizontal CCD register 85 is shown in the left hand side.

The first light shielding film 110 formed for the vertical CCD register 83 is terminated on a final electrode among the electrode layers 108 of the vertical CCD register 83. On the other hand, the resin light shielding film 20 is formed so as to cover a part of the final electrode of the vertical CCD register 83 in addition to the electrode layer 108' of the horizontal CCD register 83.

With such a structure, the resin light shielding film 20 is overlapped with the light shielding film 110 at the end portion to each other. In this event, invasion of a light beam from a border portion between these light shielding films can be prevented by overlapping the first light shielding film 110 with the second light shielding film 20 (namely, the resin light shielding film) at the end portion to each other.

In this case, opening portions are not formed for several of pixels, which are positioned at the horizontal CCD register side, among pixels formed on the image region 81. These pixels are utilized to detect optical black. Namely, the photoelectric conversion operation is not carried out in the photo-diodes corresponding to these pixels. Therefore, the border between the light shielding film 110 and the resin light shielding film 20 may be formed by this pixel shape.

As mentioned before, the resin light shielding film 20 is used as a light shielding film for the horizontal CCD register 85. Consequently, the parasitic capacitance regarding the electrode layer 108' can be reduced, and as a result, power consumption can be also reduced.

In this case, the resin light shielding film 20 is inferior in capability for interrupting a light beam in comparison with the light shielding film of the metal. However, an error signal, which is superimposed to the signal charges during the horizontal scanning period, is negligibly small because the horizontal CCD register operates at high frequency of 10 MHz or more.

Figure 10A:
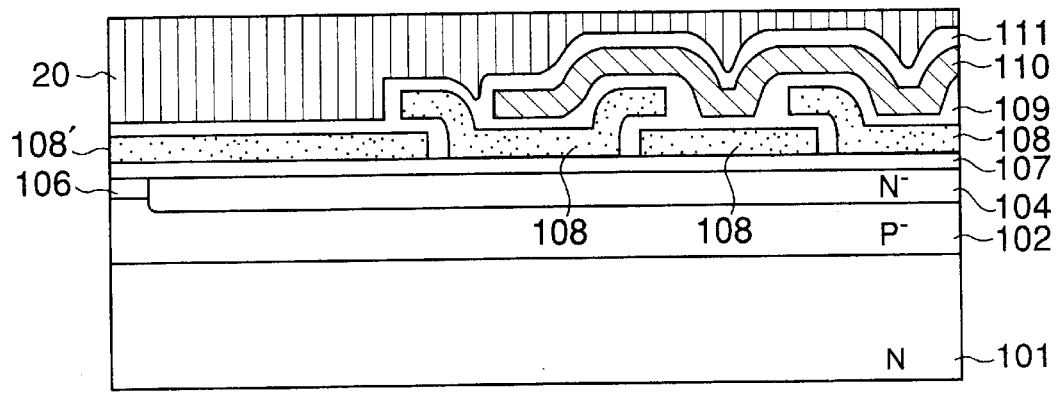
FIGS. 10A and 10B are cross sectional views showing a method of manufacturing the solid-state image device illustrated in FIG. 7.
Figure 10B:
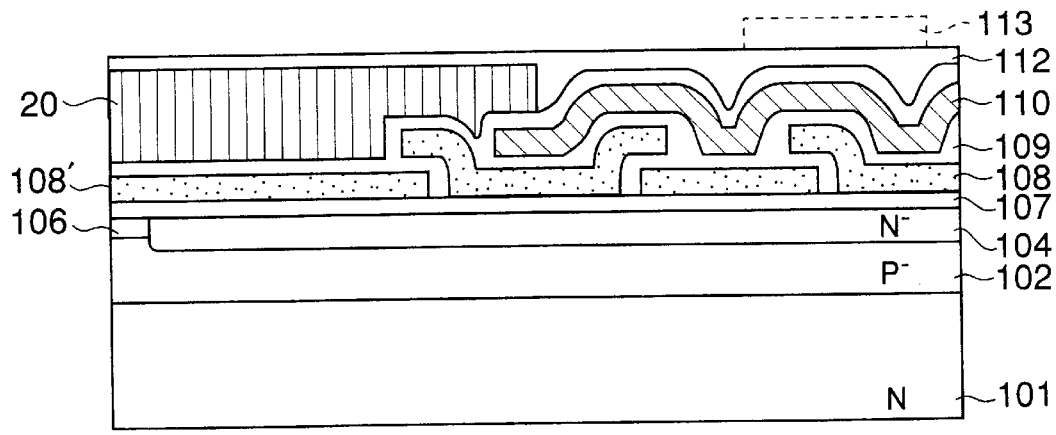

Referring to FIGS. 10A and 10B, description will be made about a method of manufacturing the above-mentioned solid-state image device.

First, a P-well 102 is formed on an N-type semiconductor substrate 101. Thereafter, an impurity diffusion layer, such as, an N-type impurity layer 104 and a P-type high concentration impurity layer 106 is formed in the P-well 102.

Subsequently, a gate insulating film 107 is deposited on the impurity diffusion layers 104 and 106 formed in the P-well 102. Next, an electrode layers 108 and 108' and an insulating film 109 is formed on the insulating film 107 by the use of the known patterning process. Further, a first light shielding film 110 is formed in a predetermined region, and is covered with an insulating film 111.

The steps, which have been so far described, are carried out by the use of the well-known technique, like the conventional case.

Subsequently, a resin light shielding film (the second light shielding film) 20 is formed to the thickness of about 0.5 to 1 μm by using the known rotation coating method, as illustrated in FIG. 10A. Further, the resin light shielding film 20 is removed so that the resin light shielding film 20 is left over only the predetermined region by the use of the known etching technique. Thereby, the resin light shielding film 20 is placed over the predetermined region, as shown in FIG. 10B.

Successively, a transparent resin layer as a part of a flattening film 112 is formed by the use of the known rotation coating method. Next, a color filter layer 113 is formed at the preselected position on a surface of the transparent resin layer by the use of the known technique, as illustrated in FIG. 10B. Herein, the color filter layer 113 has three colors corresponding to each color of RGB. Therefore, the color filter is repeatedly formed three times.

Thereafter, the color filter layer is buried by rotating and coating the transparent resin layer as the flattening layer 112 and the upper surface is flattened. Finally, a micro-lens 114 is formed on the flattening film 112. Thereby, the solid-state image device illustrated in FIG. 7 is completed.

Figure 11:
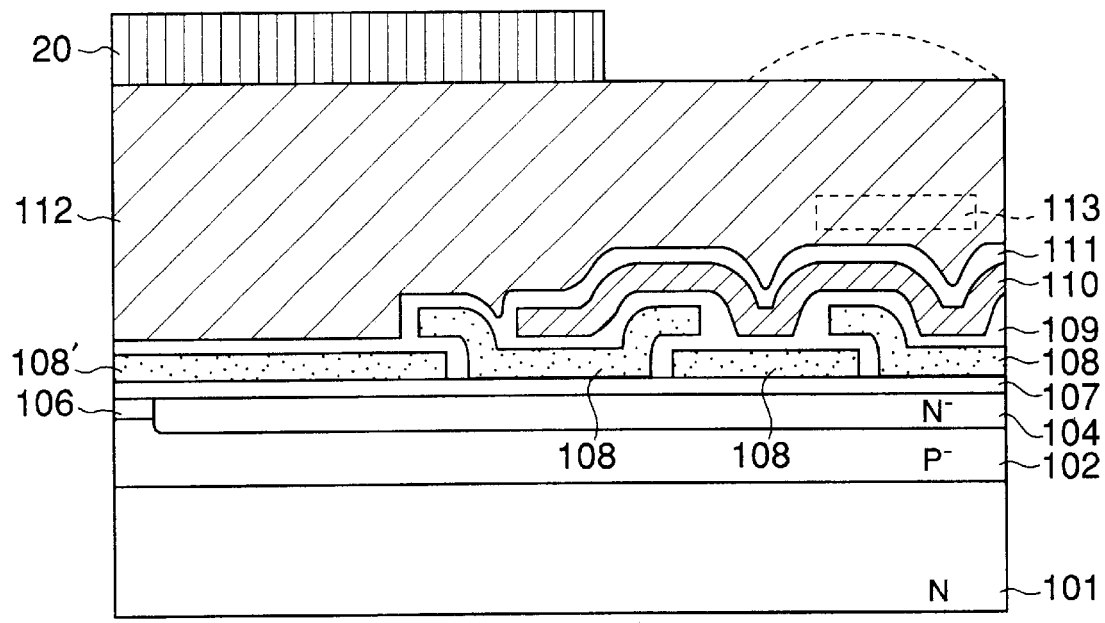
FIG. 11 is a partial cross sectional view showing a solid-state image device according to a second embodiment of this invention.

Subsequently, description will be made about a second embodiment according to this invention with reference to FIG. 11. The resin light shielding film 20 is placed on the flattening film 112 different from the first embodiment illustrated in FIG. 9 in the second embodiment. This structure can be realized by forming the resin light shielding film 20 after the micro-lens 114 is formed.

With such a structure, the resin light shielding film 20 can have the thickness of several μm because the thickness of the resin light shielding film 20 is not restricted. As a result, the light shielding performance, which is substantially equivalent to the metal film, can be obtained by the use of the resin light shielding film 20.

Subsequently, description will be made about a third embodiment according to this invention with reference to FIG. 12.

Color filters are utilized instead of the resin light shielding film 20 in the third embodiment. Namely the light shielding film is structured by laminating and overlapping color filter layers 113a, 113b, and 113c of three colors (R, G, B), as illustrated in FIG. 12. Each of the color filter layers 113 decays a light beam having a specific wavelength region in accordance with the respective colors. In consequence, the strength of the light beam, which transmits all of the three layers, is largely weakened. As a result, the same light shielding effect as the resin light shielding film 20 can be realized.

This solid-state image device is obtained as follows.

Namely, the steps immediately before forming the color filters 111 is equal to the first and second embodiments except for the step for forming the resin light shielding film 20.

Thereafter, the color filter layers 113 are formed for the horizontal CCD register 85 when the color filter layer 113 is formed for the vertical CCD register 83. Herein it is to be noted that the color filter layer 113 is formed three times to correspond with the color filter layer 113 of either one color of RGB for each pixel. However, all (three colors) of the color filter layers 113a, 113b, and 113c are formed for the horizontal CCD register. Thus, the color filter layers 113, which are originally required, are utilized without forming the specific light shielding film in the third embodiment. In consequence, the manufacturing process can be largely simplified.

Figure 12:
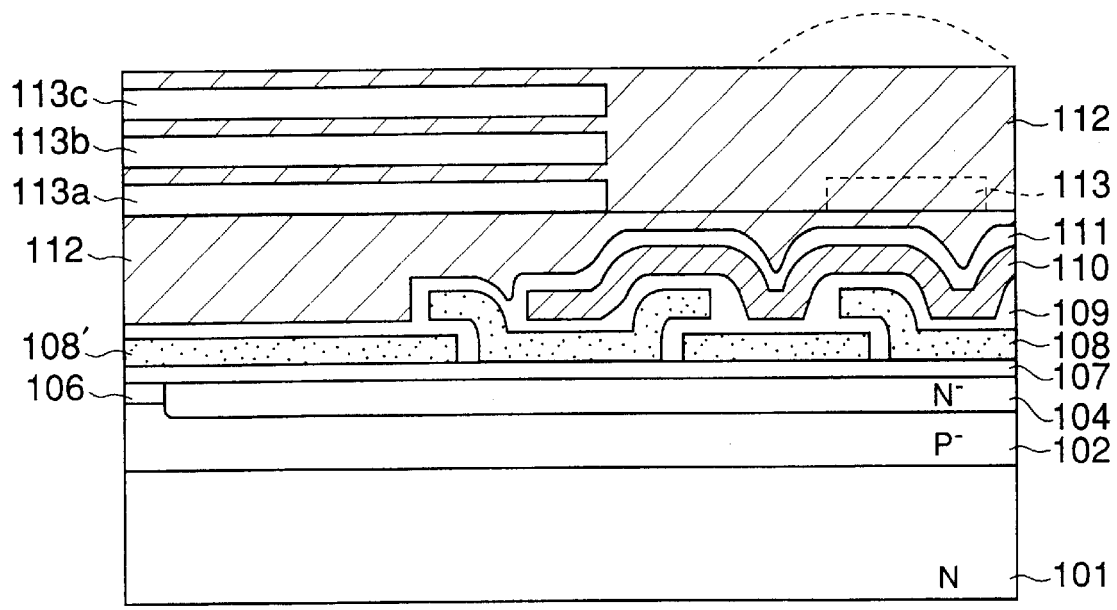
FIG. 12 is a partial cross sectional view showing a solid-state image device according to a third embodiment of this invention.

In this event, the color filter layers 113a, 113b, and 113c of three layers, which are formed for the horizontal CCD register 85, are arranged so that the end portions are entirely overlapped in the third embodiment, as illustrated in FIG. 12.

Figure 13:
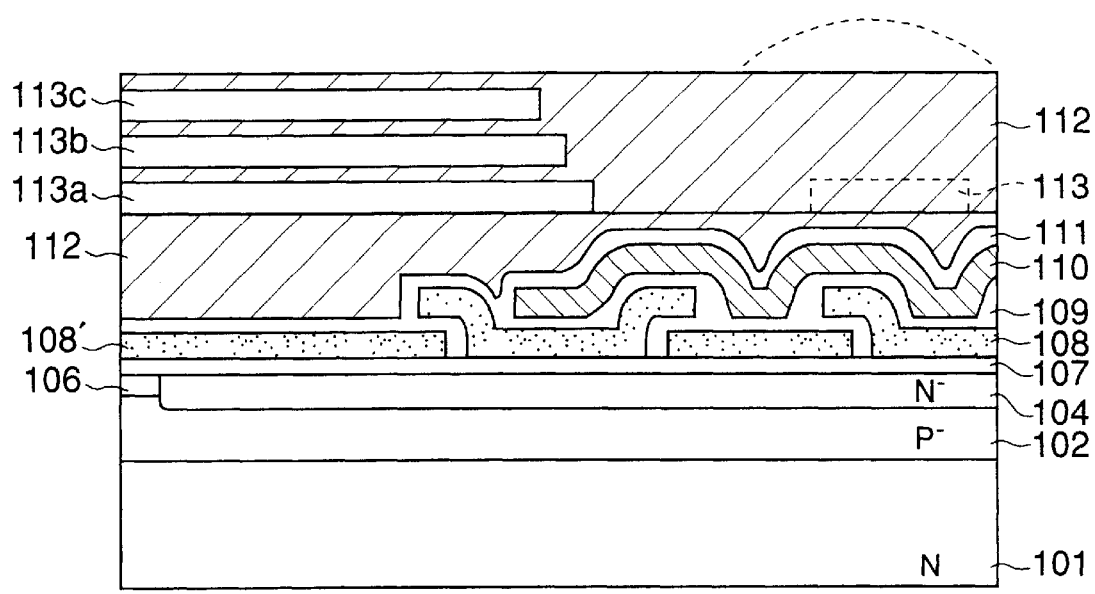
FIG. 13 is a partial cross sectional view showing a modified example of the third embodiment illustrated in FIG. 12.

However, the end portion of the upper layer may be withdrawn from the end portion of the lower layer, as illustrated in FIG. 13.

Conversely, the end portion of the upper layer may be extended from the end portion of the lower layer to the vertical CCD register side.

It is difficult that affect due to a step, which generates at the end portion of the color filter layers 113, appears by shifting the end portions of the three color filter layers 113 when the upper color filter layer is formed. Thereby, pattern formation accuracy is improved when the upper color filter layer is formed. Further, it is also difficult that the affect due the step at the end portion of the color filter layer 113 appears on the surface of the flattening layer 112. Consequently, the pattern formation accuracy of the micro-lens is largely enhanced.

As mentioned above, although description has been so far made about the CCD type solid-state image device as the embodiments according to this invention, this invention can be also applied to the solid-state image device adopting the other system, such as, the image device using a CMOS circuit.

Further, the light shielding film may be arranged on a peripheral circuit (not shown) except an electrical conversion portion.

What is claimed is:

1. A solid-state image device, comprising:
    an image region which has a plurality of optical-electrical conversion portions two-dimensionally arranged and a plurality of vertical CCD registers which are placed adjacent to said optical-electrical conversion portions arranged in line in a vertical direction, said vertical CCD register transferring electrical charge signals converted by said optical-electrical conversion portions toward the vertical direction;
    a horizontal CCD register which is coupled to said vertical CCD registers at one end and which transfers the electrical charge signals toward a horizontal direction;
    a first light shielding film which covers said image region except for said optical-electrical conversion portions and which is formed by a first material; and
    a second light shielding film which covers said horizontal CCD register and which is formed by a second material;
    the first material being different from the second material.

2. A device as claimed in claim 1, wherein:
    said horizontal CCD register includes a plurality of charge transfer electrodes for transferring the electrical charge signals under said second light shielding film, and
    said second light shielding film is arranged so as to reduce parasitic capacitance with respect to said charge transfer electrode.

3. A device as claimed in claim 1, wherein:
    the first material comprises metal or metal silicide while the second material comprises resin.

4. A device as claimed in claim 1, wherein:
    said second light shielding film partially is overlapped with said first light shielding film.

5. A device as claimed in claim 4, wherein:
    said vertical CCD register comprises a final charge transfer electrode, and
    said second light shielding film is overlapped with said first light shielding film over said final charge transfer electrode.

6. A device claimed in claim 3, wherein:
    said horizontal CCD register has a flattening film over said charge transfer electrode, and
    said second light shielding film is formed between said flattening film and said charge transfer electrode.

7. A device claimed in claim 3, wherein:

said horizontal CCD register has a flattening film over said charge transfer electrode, and said second light shielding film is formed on said flattening film.

8. A device claimed in claim 7, wherein:

said first light shielding film has first light shielding performance while said second light shielding film has second light shielding performance, and the second light shielding performance is substantially equal to the first light shielding performance by adjusting a thickness of said second light shielding film.

9. A device as claimed in claim 1, wherein:

said second light shielding film is formed by laminating a plurality of color filters.

10. A device as claimed in claim 9, wherein:

said color filters are overlapped to each other at both ends.

11. A device as claimed in claim 9, wherein:

said color filters are displaced from to each other at one end.

* * * * *